US008674332B2

(12) United States Patent
Toh et al.

(10) Patent No.: US 8,674,332 B2
(45) Date of Patent: Mar. 18, 2014

(54) RRAM DEVICE WITH AN EMBEDDED SELECTOR STRUCTURE AND METHODS OF MAKING SAME

(75) Inventors: Eng Huat Toh, Singapore (SG); Shyue Seng Tan, Singapore (SG); Elgin Quek, Singapore (SG)

(73) Assignee: GLOBALFOUNDRIES Singapore Pte Ltd, Singapore (SG)

( * ) Notice: Subject to any disclaimer, the term of this patent is extended or adjusted under 35 U.S.C. 154(b) by 168 days.

(21) Appl. No.: 13/445,658

(22) Filed: Apr. 12, 2012

(65) Prior Publication Data

US 2013/0270501 A1    Oct. 17, 2013

(51) Int. Cl.
*H01L 29/02* (2006.01)
*H01L 47/00* (2006.01)

(52) U.S. Cl.
USPC ...... 257/2; 257/4; 257/E21.04; 257/E45.002; 438/3; 438/382

(58) Field of Classification Search
USPC .......................................................... 257/4
See application file for complete search history.

(56) References Cited

U.S. PATENT DOCUMENTS

| | | | |
|---|---|---|---|
| 6,531,371 B2 | 3/2003 | Hsu et al. | 438/385 |
| 6,867,996 B2 | 3/2005 | Campbell et al. | 365/100 |
| 6,870,755 B2 | 3/2005 | Rinerson et al. | 365/148 |
| 6,946,702 B2 | 9/2005 | Jang | 257/306 |
| 7,067,865 B2 | 6/2006 | Lung | 257/296 |
| 7,157,750 B2 | 1/2007 | Bulovic et al. | 257/200 |
| 7,292,469 B2 | 11/2007 | Lee et al. | 365/163 |
| 7,569,844 B2 | 8/2009 | Lung | 257/2 |
| 7,606,055 B2 | 10/2009 | Liu | 365/51 |
| 7,786,461 B2 | 8/2010 | Lung | 257/2 |
| 7,875,493 B2 | 1/2011 | Lung | 438/95 |
| 7,956,344 B2 | 6/2011 | Lung | 257/4 |
| 8,115,586 B2 | 2/2012 | Hosoi et al. | 338/20 |
| 8,174,865 B2 | 5/2012 | Rhie et al. | 365/148 |
| 8,183,126 B2 | 5/2012 | Lee et al. | 438/455 |
| 2012/0074374 A1 | 3/2012 | Jo | 257/4 |
| 2012/0217463 A1* | 8/2012 | Hwang | 257/4 |

OTHER PUBLICATIONS

Deng et al., "Salicidation process using NiSi and its device application," *J Appl. Phys.*, 81:8047-51, 1997.
Gambino and Colgan, "Silicides and ohmic contacts," *Materials Chemistry and Physics*, 52:99-146, 1998.
Koshida et al., "Field-induced functions of porous Si as a confined system," *J. of Luminescence*, 80:37-42, 1999.

(Continued)

*Primary Examiner* — Daniel Whalen
*Assistant Examiner* — Shaka White
(74) *Attorney, Agent, or Firm* — Amerson Law Firm, PLLC (57) ABSTRACT

One device disclosed herein includes first and second sidewall spacers positioned above a semiconducting substrate, wherein the first and second sidewall spacers are comprised of at least a conductive material, a conductive word line electrode positioned between the first and second sidewall spacers and first and second regions of variable resistance material positioned between the conductive word line electrode and the conductive material of the first and second sidewall spacers, respectively. This example also includes a base region of a bipolar transistor in the substrate below the word line electrode, an emitter region formed below the base region and first and second collector regions formed in the substrate within the base region, wherein the first collector region is positioned at least partially under the first region of variable resistance material and the second collector region is positioned at least partially under the second region of variable resistance material.

38 Claims, 11 Drawing Sheets

(56) References Cited

OTHER PUBLICATIONS

Liu et al., "Observation of Switching Behaviors in Post-Breakdown Conductions in NiSi-gated Stacks," IEDM09:135-138, 2009.

Ma et al., "Nonvolatile electrical bistability of organic/metal-nanocluster/organic system," *Applied Physics Letters*, 82:1419-21, 2003.

Raghavan et al., "Unipolar recovery of dielectric breakdown in fully silicided high-k gate stack devices and its reliability implications," *Applied Physics Letters*, 96:142901, 2010.

Rozenberg et al., "Nonvolatile Memory with Multilevel Switching: a Basic Model," *Physical Review Letters*, 92:178302, 2004.

Sakamoto et al., "Nanometer-scale switches using copper sulfide," *Applied Physics Letters*, 82:3032-34, 2003.

Terabe et al., "Ionic/electronic mixed conductor tip of a scanning tunneling microscope as a metal atom source for nanostructuring," *Applied Physics Letters*, 80:4009-11, 2002.

Chindalore et al., "Embedded Split-Gate Flash Memory with Silicon Nanocrystals for 90nm and Beyond," *2008 Symposium on VLSI Technology Digest of Technical Papers*, pp. 136-137, 2008.

Chiu et al., "A Low Store Energy, Low VDDmin, Nonvolatile 8T2R SRAM with 3D Stacked RRAM Devices for Low Power Mobile Applications," *2010 Symposium on VLSI Circuits/Technical Digest of Technical Papers*, pp. 229-230, 2010.

Kuegeler et al., "Materials, technologies, and circuit concepts for nanocrossbar-based bipolar RRAM," *Appl. Phys. A*, 102:791-809, 2011.

Lee et al., "2-stack 1D-1R Cross-point Structure with Oxide Diodes as Switch Elements for High Density Resistance RAM Applications," *2007 IEEE*, pp. 771-774, 2007.

Russo et al., "Filament Conduction and Reset Mechanism in NiO-Based Resistive-Switching Memory (RRAM) Devices," *IEEE Transactions on Electron Devices*, 56:186-192, 2009.

Sekar, "IEEE SCV EDS Technical Events, Nov. 16, 2010, Resistive RAM: Technology and Market Opportunities" Presentation, 2010.

Shimizu et al., "A Novel High-Density $5F^2$ NAND STI Cell Technology Suitable for 256Mbt and 1Gbit Flash Memories," *1997 IEEE*, pp. 97-271-97-274, 1997.

Tseng et al., "High Density and Ultra Small Cell Size of Conctact ReRAM (CR-RAM) in 90nm CMOS Logic Technology and Circuits," *2009 IEEE*, pp. 09-109-09-112, 2009.

Tsunoda et al., "Low Power and High Speed Switching of Ti-doped NiO ReRAM under the Unipolar Voltage Source of less than 3 V," *2007 IEEE*, pp. 767-770, 2007.

Wei et al., "Highly Reliable $TaO_x$ ReRAM and Direct Evidence of Redox Reaction Mechanism," *2008 IEEE*, pp. 293-296, 2008.

Whang et al., "Novel 3-Dimensional Dual Control-Gate with Surrounding Floating-Gate (DC-SF) NAND Flash Cell for 1Tb File Storage Application," *2010 IEEE*, pp. 10-668-10-671, 2010.

\* cited by examiner

RRAM DEVICE WITH AN EMBEDDED SELECTOR STRUCTURE AND METHODS OF MAKING SAME

BACKGROUND OF THE INVENTION

1. Field of the Invention

Generally, the present disclosure relates to the manufacturing of sophisticated semiconductor devices, and, more specifically, to a compact RRAM (Resistance Random Access Memory) device with an embedded bipolar junction transistor selector structure and various methods of making such an RRAM device.

2. Description of the Related Art

As is well known, non-volatile memory devices are characterized in that there is no loss of data stored in their memory cells, even when an external power supply is removed. For that reason, such non-volatile memory devices are widely employed in a computer, a mobile communication system, a memory card and the like.

Flash memory structures are widely used in such non-volatile memory applications. The typical flash memory device employs memory cells having a stacked gate structure. The stacked gate structure typically includes a tunnel oxide layer, a floating gate, an inter-gate dielectric layer and a control gate electrode, which are sequentially stacked above a channel region. While flash memory structures have enjoyed enormous success, the continued and ever-present drive to reduce the size of integrated circuit products has created many challenges for the continued scaling of flash memory devices. Such challenges include scaling of program/erase voltages, access speed, reliability, the number of charges stored per floating gate, etc.

A resistance random access memory (RRAM) device is a memory device in which a variable resistance material layer is used as a data storage material layer. The resistance of the variable resistance material layer may be varied or changed based upon the polarity and/or amplitude of an applied electric pulse. The electric field strength or electric current density from the pulse, or pulses, is sufficient to switch the physical state of the materials so as to modify the properties of the material and establish a highly localized conductive filament (CF) in the variable resistance material. The pulse is of low enough energy so as not to destroy, or significantly damage, the material. Multiple pulses may be applied to the material to produce incremental changes in properties of the material. One of the properties that can be changed is the resistance of the material. The change may be at least partially reversible using pulses of opposite polarity or pulses having a different amplitude from those used to induce the initial change.

In general, after an RRAM device is initially fabricated, the variable resistance material layer does not exhibit any switching properties. Rather, a high-voltage, high-current process, a so-called FORMING process, is performed to initially form the localized conductive filament with oxygen vacancies from the cathode, establishing a low-resistance state (LRS) exhibiting a relatively high current flow. A so-called RESET process is performed to break the conductive filament and establish a high-resistance state (HRS) exhibiting a relatively low current flow. Note that the RESET process removes only a portion of the entire length of the conductive filament, i.e., the RESET process does not remove the entire conductive filament. After a RESET process is performed, a so-called SET process is performed to re-establish the conductive filament and thus the low-resistance state of the RRAM device. The SET process is essentially the same as the FORMING process except that the SET process is performed at a lower voltage than the FORMING process since the filament length to be re-established is shorter than the length of the conductive filament that was formed during the FORMING process.

The variable resistance material layer employed in an RRAM device may be comprised of a material capable of having its resistivity changed in response to an electrical signal. Such materials may include a perovskite material, such as a colossal magnetoresistive (CMR) material or a high temperature superconducting (HTSC) material, for example $Pr_{0.7}Ca_{0.3}MnO_3$ (PCMO). Another example of a suitable material is $Gd_{0.7}Ca_{0.3}BaCo_2O_{5+\delta}$. Other possible materials for the variable resistance layer include transition metal oxides such as hafnium oxide, titanium oxide, nickel oxide, tungsten oxide, tantalum oxide, copper oxide, etc., manganites, titanates (e.g., STO:Cr), zirconates (e.g., SZO:Cr, $Ca_2Nb_2O_7$:Cr, $Ta_2O_5$:Cr), and high Tc superconductors (e.g., YBCO). RRAM devices may be advantageous in highly scaled, high integration applications due to their relatively smaller foot print as compared to a capacitor based memory device in which memory characteristics are proportional to the size of a cell area.

The present disclosure is directed to a novel, compact RRAM (Resistance Random Access Memory) device structure and various methods of making such an RRAM device.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a compact RRAM device with an embedded bipolar transistor selector structure and various methods of making such an RRAM device. In one example, the device includes first and second sidewall spacers positioned above a semiconducting substrate, wherein the first and second sidewall spacers are comprised of at least a conductive material, a conductive word line electrode positioned between the first and second sidewall spacers and first and second regions of variable resistance material positioned between the conductive word line structure and the conductive material of the first and second sidewall spacers, respectively. This illustrative embodiment further includes a base region of a bipolar junction transistor formed in the substrate below the conductive word line electrode, an emitter region of the bipolar junction transistor formed in the substrate below the base region and first and second spaced-apart collector regions formed in the substrate within the base region, wherein the first collector region is positioned at least partially under the first region of variable resistance material and the second collector region is positioned at least partially under the second region of variable resistance material.

In another example, a memory array is disclosed herein that is comprised of a plurality of the RRAM devices disclosed, wherein a dedicated bit line contact is formed to each of the regions of variable resistance material for each device and the emitter regions of each device are conductively coupled to a common select line.

In another example, another illustrative memory array is disclosed herein that is comprised of a plurality of the RRAM devices, wherein a dedicated bit line contact is formed to one of the regions of variable resistance material in each of the devices and a common bit line contact is formed that contacts a region of variable resistance material in the first RRAM device and a region of variable resistance material in the second RRAM device. In this illustrative example, each of the RRAM devices is provided with a dedicated select line that is conductively coupled to the emitter region of that device.

One illustrative method disclosed herein includes forming a dielectric material structure above a semiconducting substrate, forming first and second regions of variable resistance material above the substrate proximate first and second sides of the dielectric material structure, respectively, forming first and a second conductive structures above the substrate, wherein the first conductive structure is positioned proximate the first region of variable resistance material and the second conductive structure is positioned proximate the second region of variable resistance material, forming a trench in the dielectric material structure and forming a conductive word line electrode in the trench.

Another illustrative method disclosed herein includes forming a doped base region in a semiconducting substrate, forming a dielectric material structure above the doped base region, forming first and second spaced-apart collector regions in the substrate within the base region, forming first and second regions of variable resistance material above the substrate proximate first and second sides of the dielectric material structure, respectively, forming first and second conductive structures above the substrate, wherein the first conductive structure is positioned proximate the first region of variable resistance material and the second conductive structure is positioned proximate the second region of variable resistance material, forming a trench in the dielectric material structure and forming a conductive word line electrode in the trench.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to a compact RRAM (Resistance Random Access Memory) device structure with an embedded bipolar transistor selector structure and various methods of making such an RRAM device. As will be readily apparent to those skilled in the art upon a complete reading of the present application, the device disclosed herein may be employed with a variety of technologies, e.g., NMOS, PMOS, CMOS, etc., and it may be incorporated into a variety of devices. With reference to the attached drawings, various illustrative embodiments of the methods and devices disclosed herein will now be described in more detail.

Figure 1A:
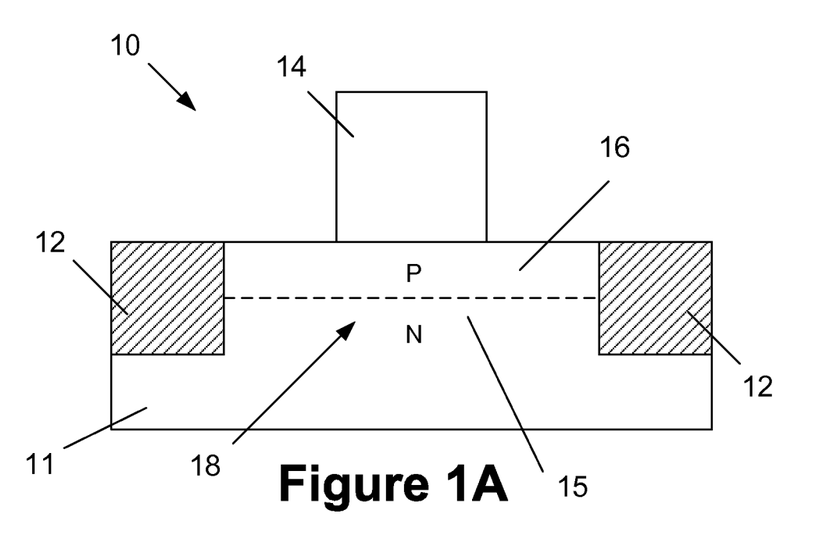
FIGS. 1A-1G depict one illustrative process flow for forming a novel RRAM device disclosed herein.

FIGS. 1A-1G depict one illustrative process flow for forming one illustrative embodiment of the various novel RRAM devices 10 disclosed herein. FIG. 1A is a simplified view of an illustrative RRAM device 10 at an early stage of manufacturing. The RRAM device 10 is formed in and above an active region that is defined by an illustrative trench isolation structure 12 formed in a semiconducting substrate 11. The substrate 11 may have a variety of configurations, such as the depicted bulk silicon configuration. The substrate 11 may also have a silicon-on-insulator (SOI) configuration that includes a bulk silicon layer, a buried insulation layer and an active layer, wherein semiconductor devices are formed in and above the active layer. Thus, the terms substrate or semiconducting substrate should be understood to cover all semiconductor structures. The substrate 11 may also be made of materials other than silicon.

Figure 1B:
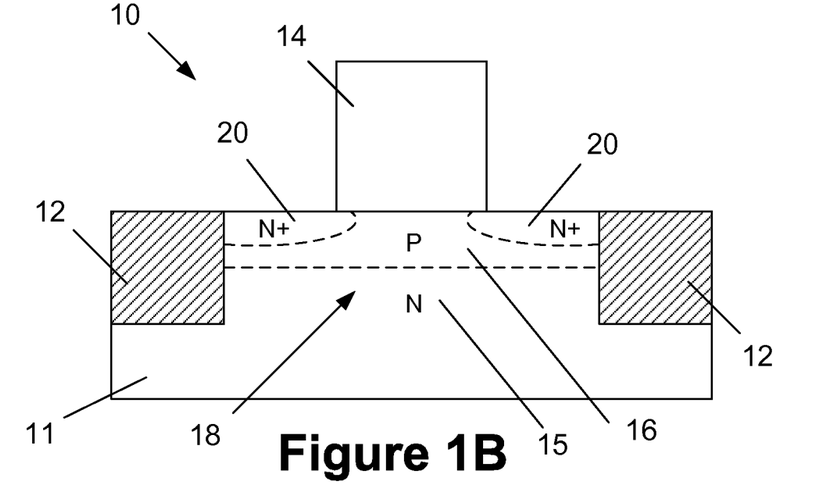

At the point of fabrication depicted in FIGS. 1A-1B, various doped regions are formed in the substrate 11 that will define an embedded bipolar junction transistor 18 selector structure for the RRAM device 11. As will be recognizes by those skilled in the art after a complete reading of the present application, the bi-polar junction transistor 18 may be either an N-P-N or a P-N-P bipolar junction transistor. In the examples described and discussed herein, the bipolar junction transistor 18 will be described as being an illustrative N-P-N bipolar junction transistor, but the presently disclosed inventions should not be considered as being limited to such an illustrative example.

As shown in FIG. 1A, a doped emitter region 15 and a doped base region 16 have been formed in the substrate 11. In one illustrative embodiment, the emitter region 15 is comprised of N-type dopant material while the base region 16 is comprised of P-type dopant material. The doped regions 15, 16 may be formed using any of a variety of techniques. For example, the emitter region 15 may be formed by performing known ion implantation techniques through a patterned mask layer (not shown) or the N-type dopant material may be introduced into the substrate 11 when the substrate 11 is initially manufactured, or by performing a combination of such processes. Similarly, the base region 16 may be formed by performing known ion implantation techniques through a patterned mask layer (not shown). The dopant dose and implant energies used in such implantation processes may vary depending upon the particular application. Also depicted in FIG. 1A is a word line dielectric material 14 that has been form above the substrate 11 by performing known deposition and etching processes. The size and material of the word line dielectric material 14 may vary depending upon the particular application. In one illustrative embodiment, the word line dielectric material 14 may be comprised of silicon dioxide, silicon nitride, a plurality of dielectric layers like silicon nitride on silicon dioxide, etc.

Next, as shown in FIG. 1B, an ion implantation process is performed through a patterned mask layer (not shown) to form a plurality of doped collector regions 20 in the substrate 11 adjacent the word line dielectric material 14. In one illustrative embodiment, the collector regions 20 are comprised of N-type dopant material. The dopant dose and implant energies used to form the collector regions 20 may vary depending upon the particular application. In one embodiment, the collector regions 20 have a higher concentration of N-type dopant material than does the emitter region 15. After the various doped regions 15, 16 and 20 are formed, the device 10 may be subjected to an anneal process to activate the implanted dopant materials and to repair any implant damage to the substrate 11. Thereafter, if desired, metal silicide regions (not shown) may be formed on the collector regions 20 by using known techniques for forming such metal silicide regions.

Figure 1C:
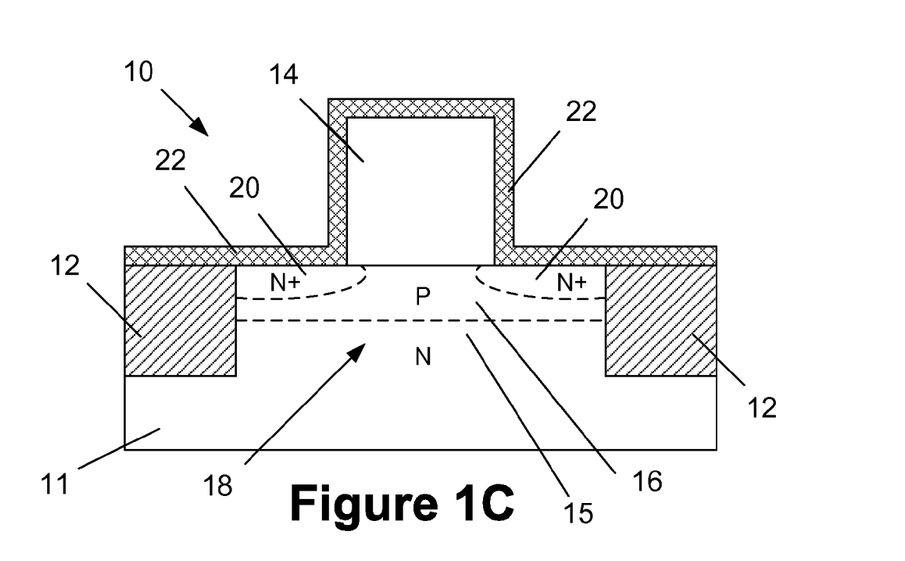

Next, as shown in FIG. 1C, a conformable deposition process is performed to form more layers 22 of variable resistance material above the device 10 that will eventually be used to form variable resistance material liners (not shown in FIG. 1C) positioned adjacent the word line dielectric material 14. As will be described more fully below, at least the variable resistance material spacers will become all or part of the bit lines for the RRAM device 10. The layer or layers 22 may be made of any variable resistance material that is capable of having its resistivity changed in response to an electrical signal. The variable resistance materials may be formed by performing a variety of conformable deposition processes, such as a chemical vapor deposition (CVD) process, an atomic layer deposition (ALD) process, or plasma-enhanced versions of those processes, etc. In one illustrative example, the layer or layers 22 may be made of one or more of the following illustrative materials: a perovskite material, such as a colossal magnetoresistive (CMR) material or a high temperature superconducting (HTSC) material, for example $Pr_{0.7}Ca_{0.3}MnO_3$ (PCMO), s $Gd_{0.7}Ca_{0.3}BaCo_2O_{5+5}$, a transition metal oxide such as hafnium oxide, titanium oxide, nickel oxide, tungsten oxide, tantalum oxide, copper oxide, etc., manganites, titanates (e.g., STO:Cr), zirconates (e.g., SZO:Cr, $Ca_2Nb_2O_7$:Cr, $Ta_2O_5$:Cr), and high Tc superconductors (e.g., YBCO), etc.

Figure 1D:
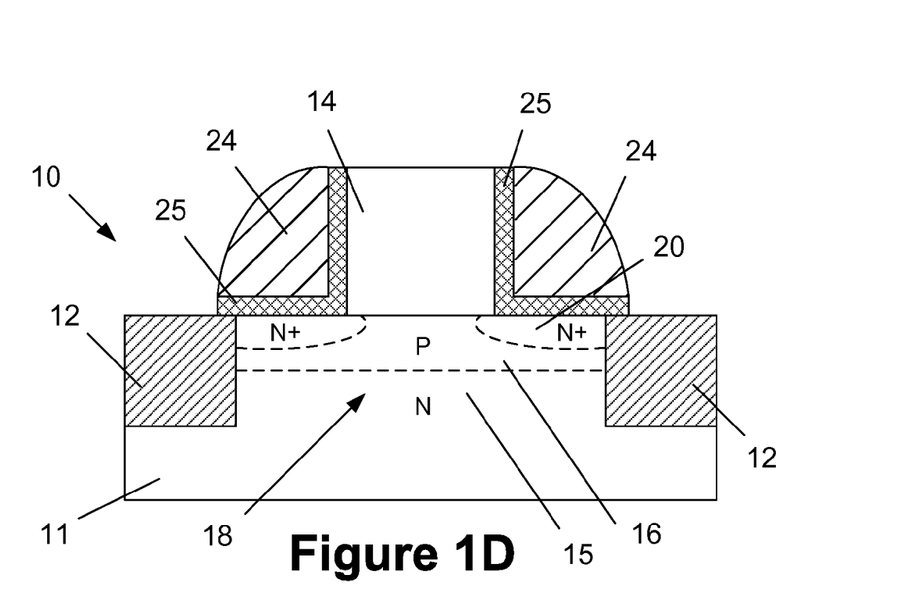

FIG. 1D depicts the RRAM device 10 after sidewall spacers 24 and the variable resistance material liners 25 are formed on the device 10. At least portions of the spacers 24 are positioned above the collector regions 20 and the resistance material liners 25. In one illustrative embodiment, the sidewall spacers 24 have a base width of about 10-100 nm. In one illustrative embodiment, the sidewall spacers 24 may be made of one or more layers of the variable resistance material described above for the layers 22 in combination with at least one outer layer of a conductive material. In some applications, the sidewall spacers 24 may be made entirely of a conductive material. The conductive portion of the sidewall spacers 24 may be comprised of a variety of materials such as a metal, like titanium, tantalum, titanium nitride, tantalum nitride, tungsten, platinum, ruthenium, etc. The sidewall spacers 24 may be formed by depositing a layer or layers of material that will be used to form the sidewall spacers 24 and thereafter performing an anisotropic etching process. Then, an etching process is performed to remove exposed portions of variable resistance material layer 22. In one example, the etching process that is performed to form the sidewall spacers 24 also removes portions of the layer(s) 22 to thereby define the variable resistance material liners 25 shown in FIG. 1D. In one illustrative embodiment, the variable resistance material liners 25 have a generally L-shaped configuration and they may have a thickness that ranges from about 5-20 nm depending upon the particular application. A first portion (the vertically oriented portion) of the variable resistance material liners 25 is positioned between the word line dielectric material 14 and the sidewall spacer 24, while a second portion (the horizontally oriented portion) of the variable resistance material liners 25 is formed above the surface of the substrate 11 and separates the bottom of the sidewall spacer 24 from the collector regions 20 formed in the substrate 11. In some embodiments, the liners 25 may not be formed as the sidewall spacers 24 may be comprised of one or more layer of variable resistance material in addition to an outer conductive material.

Figure 1E:
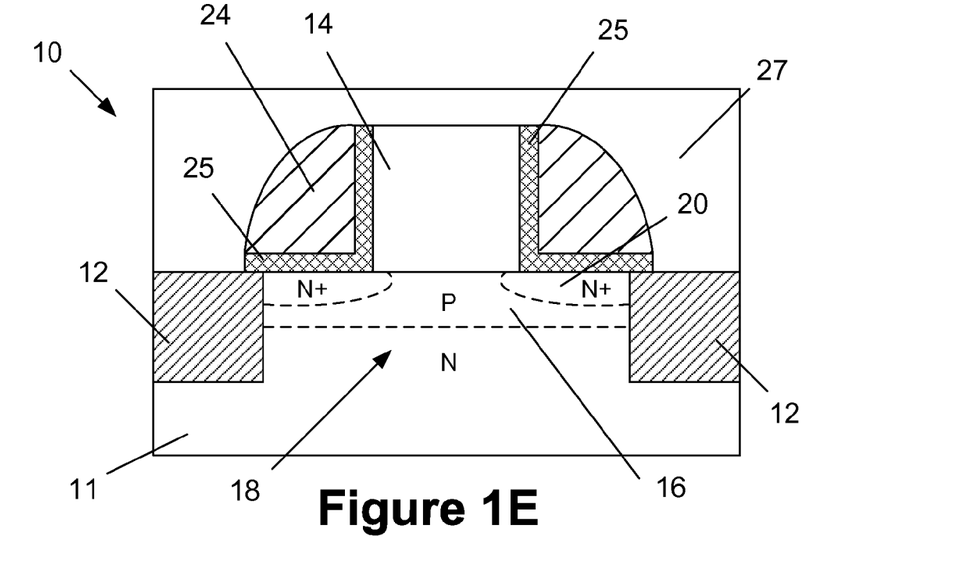

FIG. 1E depicts the RRAM device 10 after a layer of insulating material 27 is formed above the device 10 and a chemical mechanical polishing (CMP) process is performed to planarize the upper surface of the layer of insulating material.

Figure 1F:
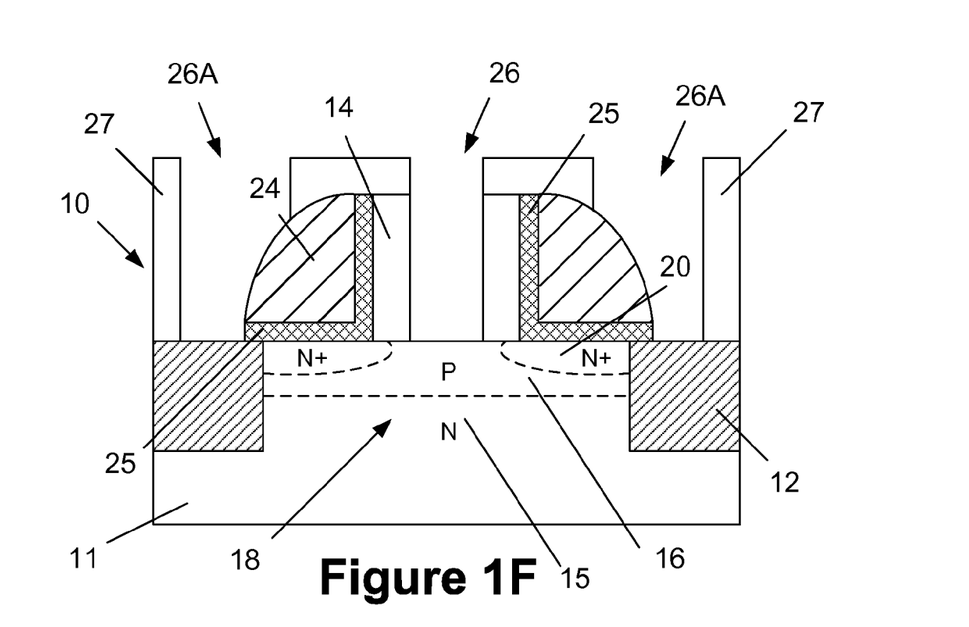

FIG. 1F depicts the device 10 after an etching process is performed on the layer of insulating material 27 and the word line dielectric material 14 through a patterned mask layer (not shown). This etching process defines an opening or trench 26 in the word line dielectric material 14 to expose the underlying substrate 11 within the opening 26 and also defines a plurality of bit line contact openings 26A. At this point, if desired, a metal silicide region (not shown) may be formed on the base region 16 exposed by the trench 26, by performing known techniques for forming such metal silicide regions.

Figure 1G:
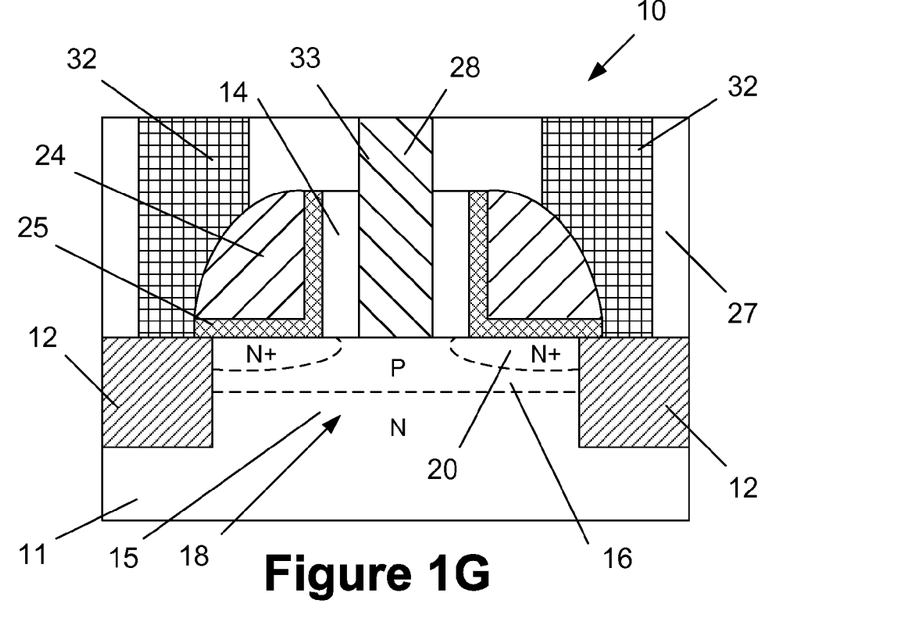

Next, as shown in FIG. 1G, a conductive word line electrode 28 is formed in the trench 26 and a plurality of bit line contacts 32 are formed in the openings 26A. The word line electrode 28 and the bit line contacts 32 may be comprised of any type of conductive material such as a metal. The word line electrode 28 and the bit line contacts 32 may be formed by over-filling the trench 26 and the openings 26A with a conductive material and thereafter performing a CMP process to remove portions of the conductive material positioned outside of the trench 26 and the openings 26A. Of course, the word line electrode 28 and the bit line contacts 32 will not be formed in the same plane.

Figure 2A:
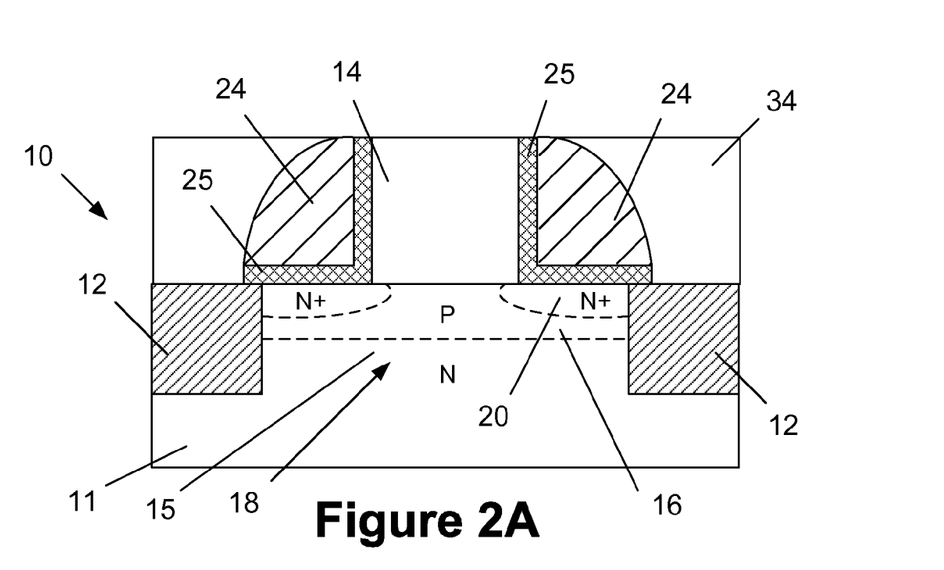
FIGS. 2A-2D depict another illustrative process flow for forming a novel RRAM device disclosed herein.
Figure 2B:
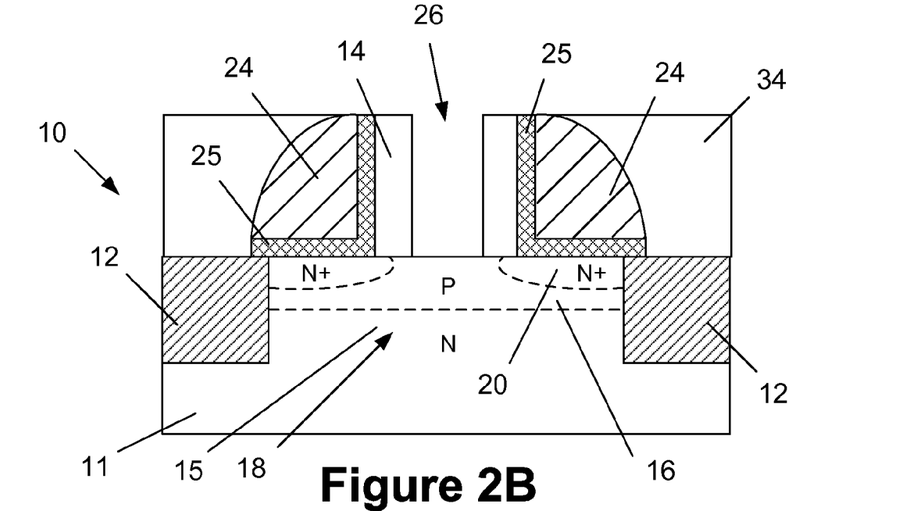
Figure 2C:
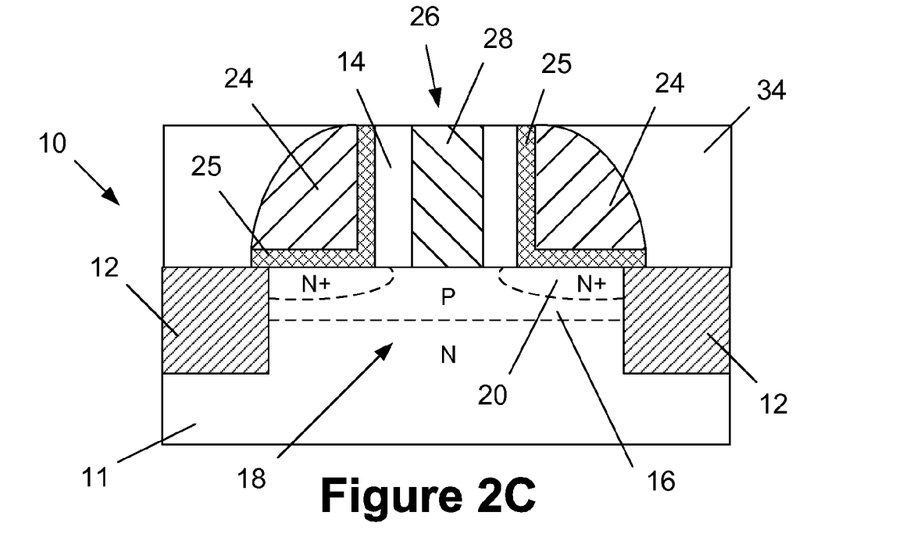
Figure 2D:
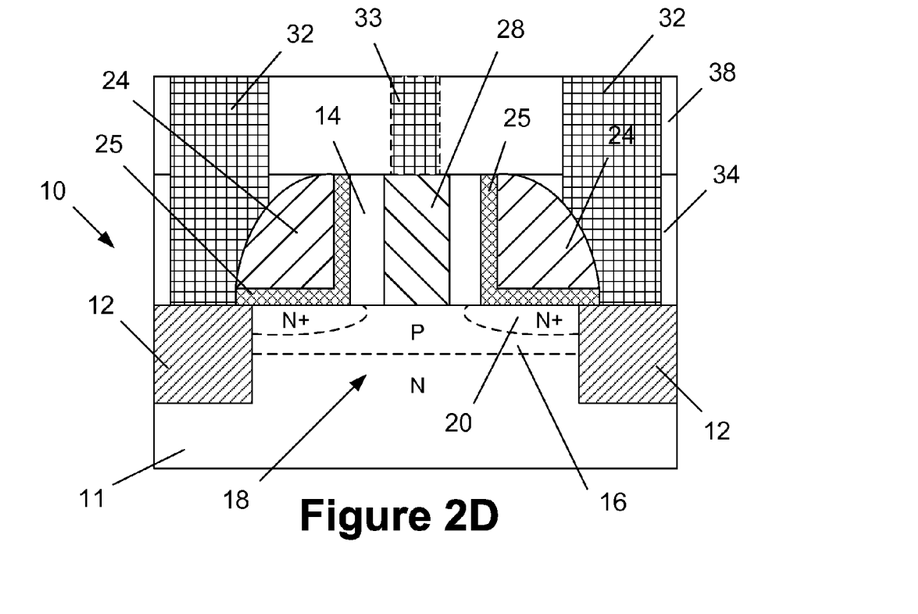

FIGS. 2A-2D depict another illustrative process flow that may be used to form the various RRAM devices disclosed herein. FIG. 2A depicts the device 10 at a point of fabrication that corresponds to that shown in FIG. 1D, with the addition of a layer of insulating material 34. The layer of insulating material 34 may be formed by depositing the insulating material and thereafter performing a CMP process. In one illustrative embodiment, the layer of insulating material 34 may be comprised of silicon dioxide, silicon nitride, a plurality of dielectric layers like silicon nitride on silicon dioxide, etc. Next, as shown in FIGS. 2B-2C, as described above, the trench 26 is formed in the word line dielectric 14 and the conductive word line electrode 28 is formed in the trench 26. Then, as shown in FIG. 2D, another layer of insulating material 38 is formed above the device 10 and the bit line contacts 32 and word line contacts 33 are formed on the device 10. The word line contacts 33 are depicted in dashed lines because they will not be formed in the same plane as the bit line contacts 32.

Figure 3A:
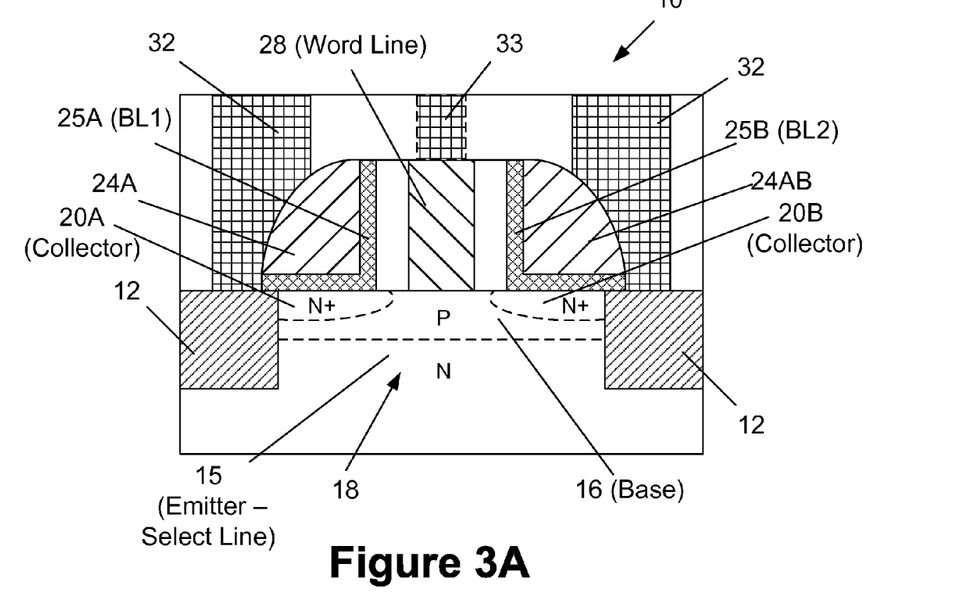
FIGS. 3A-3C depict various illustrative operational aspects of one illustrative embodiment of a novel RRAM device disclosed herein.
Figure 3B:
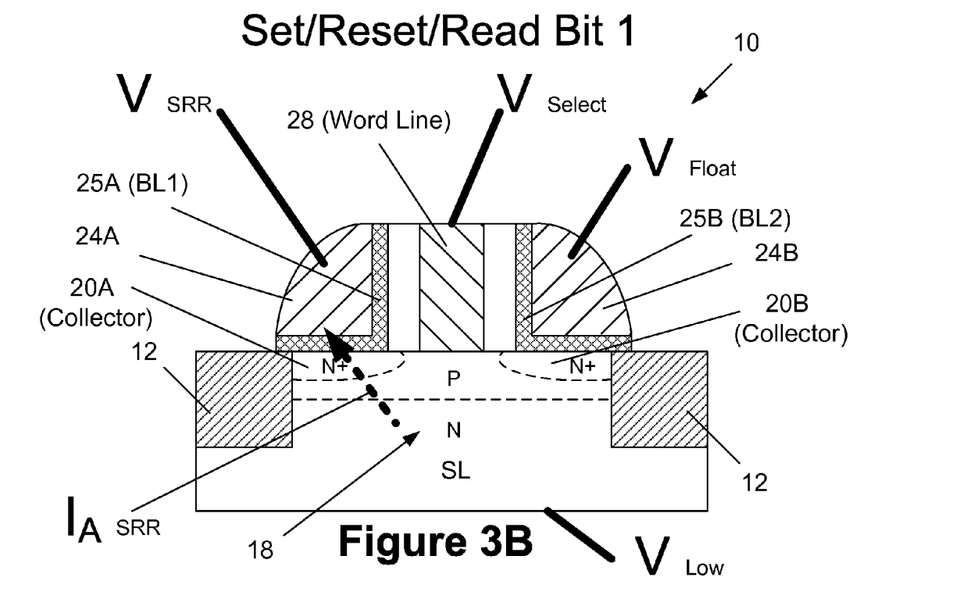
Figure 3C:
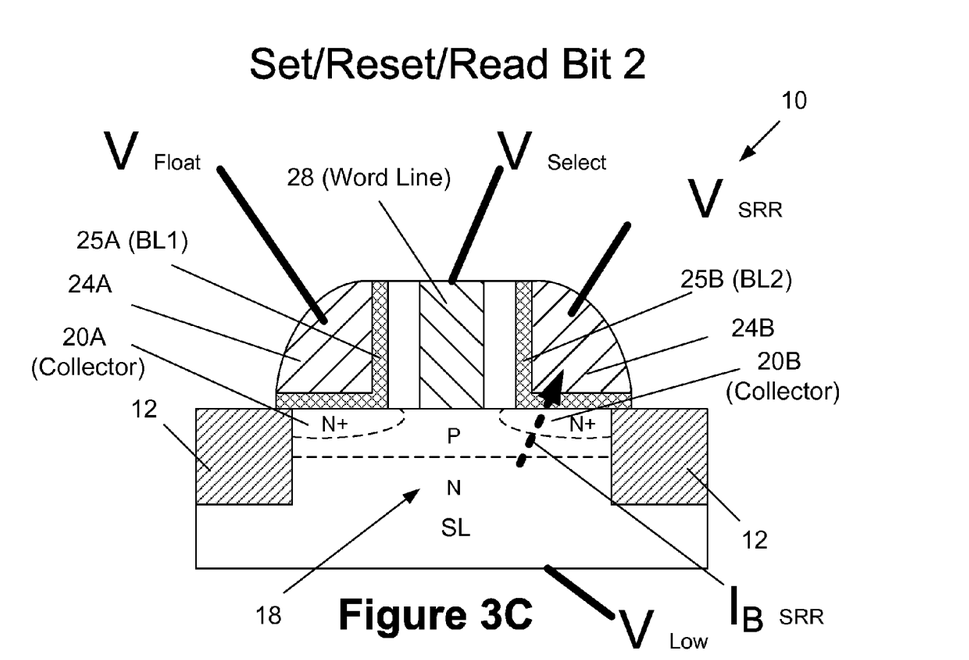

FIGS. 3A-3C are provided to describe various operational aspects of the novel RRAM devices 10 disclosed herein. With reference to FIG. 3A, and as mentioned previously, the RRAM devices 10 disclosed herein comprise an embedded bipolar transistor junction 18 selector structure. The device 10 includes an emitter region 15 that will serve as a select line, a base region 16 and first and second collector regions 20A, 20B. In operation, the emitter region 15, base region 16 and one of the collector regions 20 will define the bipolar junction transistor 18. In one illustrative embodiment, a first variable resistance material liner 25A defines a first bit line (BL1) while the second variable resistance material liner 25B defines a second bit line (BL2). The collector 20A is associated with the first bit line 25A, while the collector 20B is associated with the second bit line 25B. In one illustrative embodiment, a first sidewall spacer 24A is associated with the first variable resistance material liner 25A and a second sidewall spacer 25B is associated with the second variable resistance material liner 25B. As noted earlier, in some embodiments, the liners 25A, 25B may not be formed as the sidewall spacers 24A, 24B may be comprised of one or more layers of variable resistance material in addition to an outer conductive material.

FIGS. 3B, 3C schematically depict the various voltages that may be applied to various structures of the device 10 when it is desired to perform a SET, RESET or READ operation on the first bit line 25A and the second bit line 25B, respectively. Four illustrative voltages are indicated: 1) $V_{SRR}$—the voltage applied during a Set, Reset or Read operation; 2) $V_{Select}$—the voltage applied to the word line electrode 28 to select and activate the word line; 3) $V_{Float}$—no voltage is applied; and 4) $V_{Low}$—a voltage that may be applied to the emitter region 15 of the bipolar transistor 18. The absolute magnitude and/or polarity of these voltages may vary depending upon the particular RRAM device 10 at issue.

As shown in FIG. 3B, to perform a SET, RESET or READ operation on the first bit line 25A, $V_{SRR}$ is applied to the first sidewall spacer 24A, $V_{Select}$ is applied to the word line electrode 28, $V_{Low}$ is applied to the emitter region 15 of the bipolar junction transistor 18 and the voltage on the second bit line 25B is allowed to float. This produces a current $I_{A\,SRR}$ that flows from the substrate through the collector 20A to the first bit line 25A. This current causes the resistivity of material of the first bit line or liner 25A to change. This change in state of the resistance of the material of the first bit line 25A can be used to indicate the presence or absence of a bit of information.

As shown in FIG. 3C, to perform a SET, RESET or READ operation on the second bit line 25B, $V_{SRR}$ is applied to the second sidewall spacer 24B, $V_{Select}$ is applied to the word line electrode 28, $V_{Low}$ is applied to the emitter region 15 of the bipolar transistor 18 and the voltage on the first bit line 24A is allowed to float. This produces a current $I_{B\,SRR}$ that flows from the substrate through the collector 20B to the second bit line 24B. This current causes the resistivity of material of the second bit line or liner 25B to change. This change in state of the resistance of the material of the second bit line 24B can be used to indicate the presence or absence of a bit of information. Thus, this illustrative embodiment of the RRAM device 10 has the capability to store two bits of information per unit cell—in the device 10 formed between a single isolation structure 12.

The following table generally sets forth one illustrative example of the various voltages that may be applied to select ("Sel.") or unselect ("UnSel.") a bit line ("BL"), a word line ("WL") and a select line ("SL") depending upon the particular operation to be performed.

| Operation | BL (Sel) | BL (UnSel) | WL (Sel) | WL (UnSel) | SL (Sel) | SL (UNSel) |
| --- | --- | --- | --- | --- | --- | --- |
| Forming | $V_{form,High}$ | float | $V_{form,Sel}$ | float | $V_{Low}$ | $V_{Low}$ |
| SET | $V_{set,High}$ | float | $V_{set,Sel}$ | float | $V_{Low}$ | $V_{Low}$ |
| RESET (Unipolar) | $V_{reset,High}$ | float | $V_{reset,Sel}$ | float | $V_{Low}$ | $V_{Low}$ |
| RESET (Bipolar) | $V_{reset,Low}$ | float | $V_{reset,Sel}$ | float | $V_{High}$ | $V_{High}$ |
| READ | $V_{read,High}$ | float | $V_{read,Sel}$ | float | $V_{Low}$ | $V_{Low}$ |

From the table, it can be seen that, if the RRAM device 10 is operated in a unipolar manner, a relatively low voltage is applied to the emitter region 15, the embedded selector, and a relatively high voltage is applied to the bit line (BL) in the RESET operation. However, if the RRAM device 10 is operated in a bipolar manner, then a relatively high voltage is applied to the emitter region 15, the embedded selector, and a relatively low voltage is applied to the bit line (BL) during the RESET operation. Thus, one of the advantages of the embedded bipolar transistor 18 being incorporated into the RRAM device 10 is that it allows the RRAM 10 to be operated in both a unipolar and a bipolar manner.

Figure 4A:
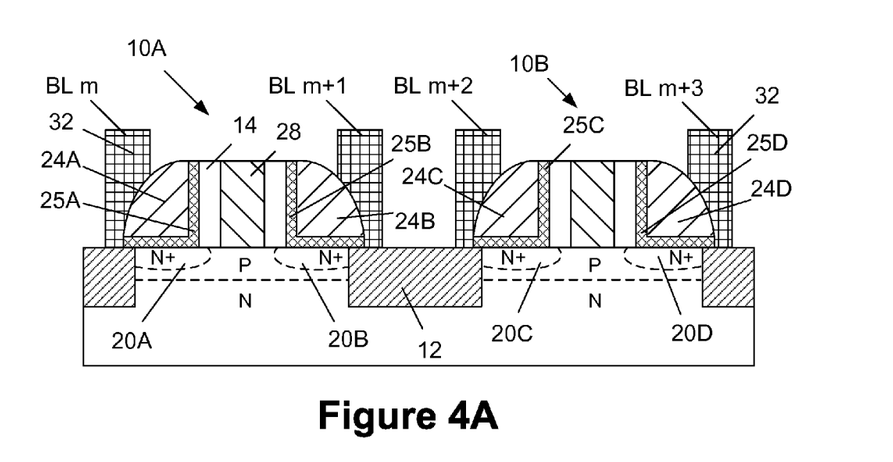
FIGS. 4A-4D depict one illustrative example of one illustrative memory array that may be formed using a plurality of novel RRAM devices disclosed herein.
Figure 4B:
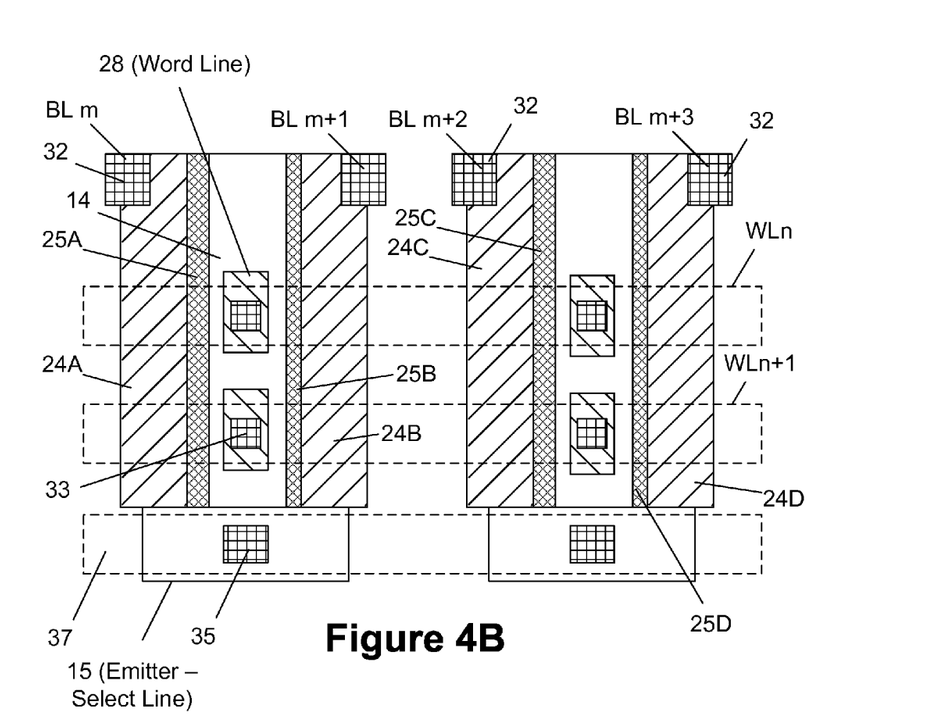

FIGS. 4A-4D depict one illustrative embodiment of an array of illustrative RRAM devices 10 disclosed herein. In the embodiment depicted in FIGS. 4A-4D, there are two illustrative RRAM devices 10A, 10B that have dedicated individual bit line contacts 32, each of which are conductively coupled to an associated bit line (bit line "m" (25A) through bit line "m+3" (25D)). As shown in FIG. 4B, the a plurality of word lines ("WLn,", "WLn+1," etc.) are conductively coupled to the word line electrode 28 in each of the devices 10 via conductive contacts 33. A common select line 37 is conductively coupled to the emitter region 15 on both of the devices 10A, 10B via emitter contacts 35. The word lines and the common select line 37 are depicted in dashed lines so as not to obscure the underlying structures, however, the word lines and the common select line 37 are typically metal lines that are formed in layers of insulating material positioned above the devices 10. Of course, the size, shape, configuration and location of the various contacts may vary depending upon the particular application or the desires of the device designer. Thus, the illustrative examples depicted herein of such structures should not be considered to be a limitation of the various inventions disclosed herein.

Figure 4C:
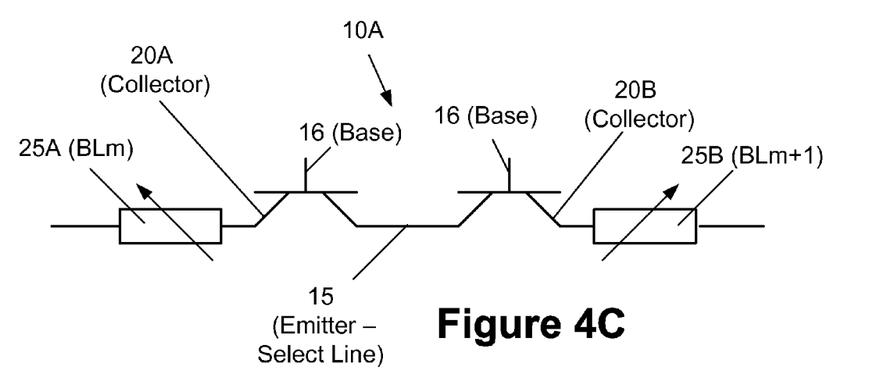
Figure 4D:
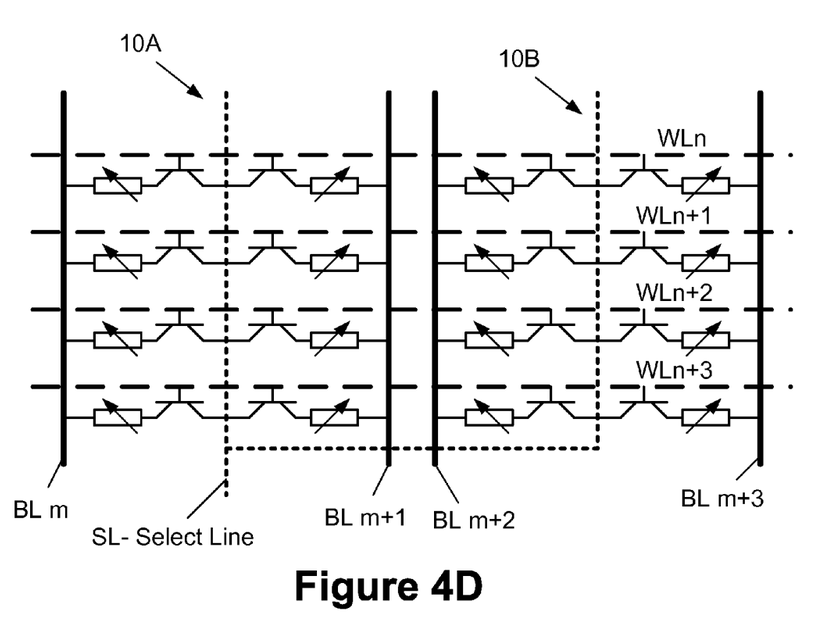

FIGS. 4C-4D are electrical schematics that depict the embodiment shown in FIGS. 4A-4B. FIG. 4C is a schematic equivalent of the device 10A shown in FIG. 4A, with the various doped regions indicated. FIG. 4D is an electrical schematic of an illustrative array of the devices 10A, 10B shown in FIGS. 4A-4B coupled to four illustrative word lines ("WLn" through "WLn+3").

Figure 5A:
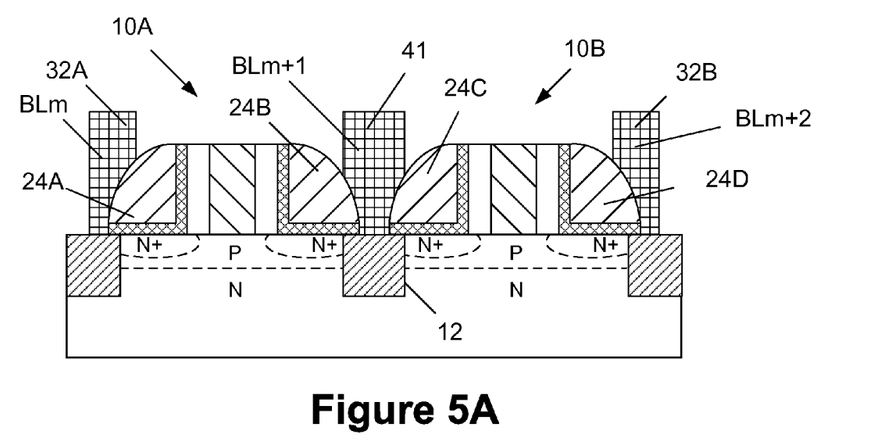
FIGS. 5A-5C depict another illustrative example of another illustrative memory array that may be formed using a plurality of novel RRAM devices disclosed herein.
Figure 5B:
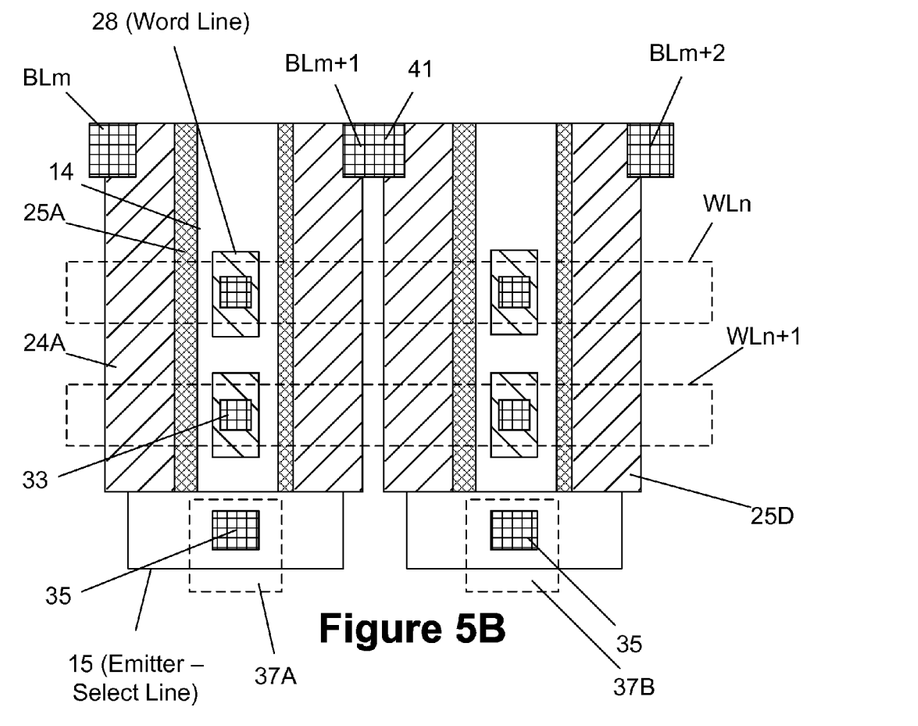
Figure 5C:
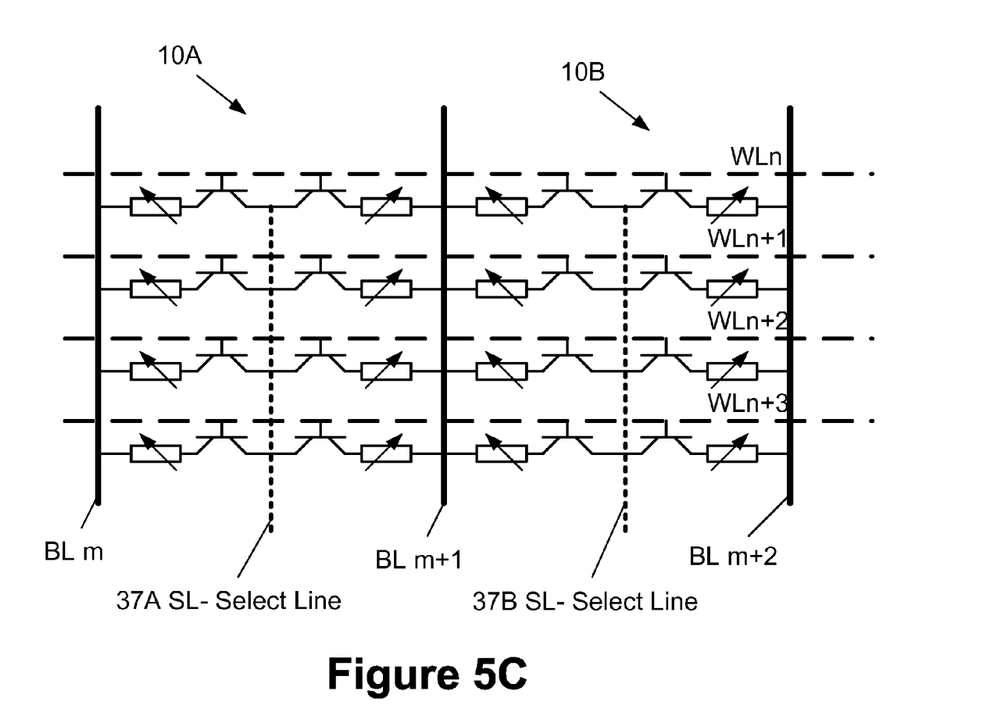

FIGS. 5A-5C depict another illustrative embodiment of an array of illustrative RRAM devices 10 disclosed herein. In the embodiment depicted in FIGS. 5A-5C, there are two illustrative RRAM devices 10A, 10B that have individual bit line contacts 32A, 32B, each of which are individually coupled to an associated bit line, i.e., bit line "m" and bit line "m+2", respectively. Unlike the embodiment depicted in FIGS. 4A-4D, in this illustrative embodiment, the devices 10A, 10B share a common bit line contact 41 (bit line "m+1") that is conductively coupled to both of the spacers 24B and 24C. Also unlike the embodiment depicted in FIGS. 4A-4D, in this illustrative embodiment, each of the devices has a dedicated select line 37A, 37B, as shown in FIG. 5B. As with the previous embodiment, a plurality of word lines ("WLn," "WLn+1," etc.) are conductively coupled to the word line electrode 28 in each of the devices 10 via conductive contacts 33. The word lines and the dedicated select line 37A, 37B are depicted in dashed lines so as not to obscure the underlying structures, however, the word lines and the dedicated select lines 37A, 37B are typically metal lines that are formed in layers of insulating material positioned above the devices 10. FIG. 5C is an electrical schematic of an illustrative array of the devices 10A, 10B shown in FIGS. 5A-5B coupled to four illustrative word lines ("WLn" through "WLn+3"). The common bit line ("m+1") as well as the dedicated select lines 37A, 37B are depicted in FIG. 5C. As will be appreciated by those skilled in the art after a complete reading of the present application, the embodiment depicted in FIGS. 5A-5C is more compact than the device shown in FIGS. 4A-4D due to the use of the common bit line contact 41. Of course, as before, the size, shape, configuration and location of the various contacts may vary depending upon the particular application or the desires of the device designer. Thus, the illustrative examples depicted herein of such structures should not be considered to be a limitation of the various inventions disclosed herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An RRAM device, comprising:
   first and second sidewall spacers positioned above a semiconducting substrate, wherein said first and second sidewall spacers are comprised of at least a conductive material;
   a conductive word line electrode positioned between said first and second sidewall spacers;
   first and second regions of variable resistance material positioned between said conductive word line electrode and said conductive material of said first and second sidewall spacers, respectively;
   a base region of a bipolar junction transistor formed in said substrate below said conductive word line electrode;
   an emitter region of said bipolar junction transistor formed in said substrate below said base region; and
   first and second spaced-apart collector regions formed in said substrate within said base region, wherein said first collector region is positioned at least partially under said first region of variable resistance material and said second collector region is positioned at least partially under said second region of variable resistance material.

2. The device of claim 1, further comprising a first region of dielectric material positioned adjacent said conductive word line, wherein said first region of variable resistance material is comprised of at least a first L-shaped liner positioned between said first region of dielectric material and said first sidewall spacer, wherein said first L-shaped liner contacts said first region of dielectric material.

3. The device of claim 2, further comprising a second region of dielectric material positioned adjacent said conductive word line, wherein said second region of variable resistance material is comprised of at least a second L-shaped liner positioned between said second region of dielectric material and said second sidewall spacer, wherein said second L-shaped liner contacts second region of dielectric material.

4. The device of claim 1, wherein said first region of variable resistance material is a portion of said first sidewall spacer.

5. The device of claim 1, wherein said second region of variable resistance material is a portion of said second sidewall spacer.

6. The device of claim 1, wherein said sidewall spacer is comprised only of a conductive material.

7. The device of claim 2, wherein said first sidewall spacer is positioned on said first L-shaped liner.

8. The device of claim 3, wherein said second sidewall spacer is positioned on said second L-shaped liner.

9. The device of claim 2, wherein said first region of variable resistance material is also a portion of said first sidewall spacer.

10. The device of claim 3, wherein said second region of variable resistance material is also a portion of said second sidewall spacer.

11. The device of claim 1, wherein said at least one variable resistance material is comprised of at least one of the following materials: a perovskite material, such as a colossal magnetoresistive (CMR) material or a high temperature superconducting (HTSC) material, for example $Pr_{0.7}Ca_{0.3}MnO_3$ (PCMO), $Gd_{0.7}CaO_{0.3}BaCo_2O_{5+\delta}$, a transition metal oxide such as hafnium oxide, titanium oxide, nickel oxide, tungsten oxide, tantalum oxide, copper oxide, manganites, titanates (e.g., STO:Cr), zirconates (e.g., SZO:Cr, $Ca_2Nb_2O_7$:Cr, $Ta_2O_5$:Cr), and high Tc superconductors (e.g., YBCO), etc.

12. The device of claim 1, wherein said bipolar transistor is one of an N-P-N bipolar transistor or a P-N-P bipolar transistor.

13. An RRAM device, comprising:
   first and second sidewall spacers positioned above a semiconducting substrate, wherein said first and second sidewall spacers are comprised of at least a conductive material;
   a conductive word line electrode positioned between said first and second sidewall spacers;
   first and second L-shaped liners comprised of variable resistance material positioned between said conductive word line electrode and said conductive material of said first and second sidewall spacers, respectively;
   a base region of a bipolar junction transistor formed in said substrate below said conductive word line electrode;
   an emitter region of said bipolar junction transistor formed in said substrate below said base region; and
   first and second spaced-apart collector regions formed in said substrate within said base region, wherein said first collector region is positioned at least partially under said first L-shaped liner and said second collector region is positioned at least partially under said second L-shaped liner.

14. The device of claim 13, further comprising first and second regions of dielectric material positioned adjacent opposite sides of said conductive word line, wherein said first and second L-shaped liners contact said first and second regions of dielectric material, respectively.

15. The device of claim 13, wherein said first and second sidewall spacers also comprise a variable resistance material.

16. The device of claim 13, wherein said first and second sidewall spacers are comprised only of a conductive material.

17. The device of claim 13, wherein said first sidewall spacer is positioned on said first L-shaped liner.

18. The device of claim 13, wherein said second sidewall spacer is positioned on said second L-shaped liner.

19. A memory array, comprising:
   a first RRAM device and a second RRAM device, each of said first and second RRAM devices comprising;
      first and second sidewall spacers positioned above a semiconducting substrate, wherein said first and second sidewall spacers are comprised of at least a conductive material;
      a conductive word line electrode positioned between said first and second sidewall spacers;
      first and second regions of variable resistance material positioned between said conductive word line electrode and said conductive material of said first and second sidewall spacers, respectively;
      a base region of a bipolar junction transistor formed in said substrate below said conductive word line electrode;
      an emitter region of said bipolar junction transistor formed in said substrate below said base region; and
      first and second spaced-apart collector regions formed in said substrate within said base region, wherein said first collector region is positioned at least partially under said first region of variable resistance material and said second collector region is positioned at least partially under said second region of variable resistance material;
   a first dedicated bit line contact that is conductively coupled to said first sidewall spacer in said first RRAM device; and
   a second dedicated bit line contact that is conductively coupled to said second sidewall spacer in said second RRAM device.

20. The device of claim 19, further comprising:
   a third dedicated bit line contact that is conductively coupled to said second sidewall spacer in said first RRAM device; and
   a fourth dedicated bit line contact that is conductively coupled to said first sidewall spacer in said second RRAM device.

21. The device of claim 19, further comprising:
   a common bit line contact that is conductively coupled to said second sidewall spacer in said first RRAM device and to said first sidewall spacer in said second RRAM device.

22. The device of claim 20, further comprising a common select line that is conductively coupled to said emitter region in each of said first and second RRAM devices.

23. The device of claim 21, further comprising:
   a first dedicated select line that is conductively coupled to said emitter region in said first RRAM device; and
   a second dedicated select line that is conductively coupled to said emitter region in said second RRAM device.

24. The device of claim 19, further comprising an isolation structure positioned in said substrate that electrically isolates said first RRAM device from said second RRAM device.

25. The device of claim 19, further comprising a plurality of word lines that are conductively coupled to said conductive word line electrode in each of said first and second RRAM devices.

26. The device of claim 19, further comprising first and second regions of dielectric material positioned adjacent opposite sides of said conductive word line, wherein said first and second regions of variable resistance material contact said first and second regions of dielectric material, respectively.

27. A method of forming an RRAM device, comprising:
   forming a dielectric material structure above a semiconducting substrate;
   forming first and second regions of variable resistance material above said substrate proximate first and second sides of said dielectric material structure, respectively;
   forming first and second conductive structures above said substrate, wherein said first conductive structure is positioned proximate said first region of variable resistance material and said second conductive structure is positioned proximate said second region of variable resistance material;
   forming a trench in said dielectric material structure; and
   forming a conductive word line electrode in said trench.

28. The method of claim 27, wherein said first and second conductive structures are sidewall spacers comprised of at least one layer of a conductive material.

29. The method of claim 27, wherein said first and second conductive structures are sidewall spacers comprised of only a conductive material.

30. The method of claim 28, wherein said first and second conductive structures are sidewall spacers comprised of at least one layer of a conductive material and at least one layer of a variable resistance material.

31. The method of claim 27, wherein said first region of variable resistance material is comprised of at least a first L-shaped liner positioned between a first portion of said dielectric material structure and said first conductive structure, wherein said first L-shaped liner contacts said first portion of said dielectric material structure.

32. The device of claim 31, wherein said second region of variable resistance material is comprised of at least a second L-shaped liner positioned between a second portion of said dielectric material structure and said second conductive structure, wherein said second L-shaped liner contacts said second portion of said dielectric material structure.

33. The method of claim 27, further comprising:
prior to forming said dielectric material structure, forming a doped base region in said substrate, wherein said dielectric material structure is formed above said doped base region; and
after forming said dielectric material structure, forming a plurality of collector regions in said substrate within said base region.

34. The method of claim 33, wherein said substrate comprises a doped emitter region positioned below said doped base region.

35. The method of claim 34, wherein said doped emitter region is formed in said substrate by in situ doping of said substrate.

36. The method of claim 34, wherein said doped emitter region is formed in said substrate by performing an ion implant process that is performed prior to forming said doped base region.

37. A method of forming an RRAM device, comprising:
forming a doped base region in a semiconducting substrate;
forming a dielectric material structure above said doped base region;
forming first and second spaced-apart collector regions in said substrate within said base region;
forming first and second regions of a variable resistance material above said substrate proximate first and second sides of said dielectric material structure, respectively;
forming first and second conductive structures above said substrate, wherein said first conductive structure is positioned proximate said first region of variable resistance material and said second conductive structure is positioned proximate said second region of variable resistance material;
forming a trench in said dielectric material structure; and
forming a conductive word line electrode in said trench.

38. The method of claim 37, wherein said substrate comprises a doped emitter region positioned below said doped base region.

* * * * *